US012640335B2

(12) United States Patent
Mizumura

(10) Patent No.: US 12,640,335 B2
(45) Date of Patent: May 26, 2026

(54) FOCUSED ION BEAM SYSTEM

(71) Applicant: V TECHNOLOGY CO., LTD.,
Kanagawa (JP)

(72) Inventor: Michinobu Mizumura, Kanagawa (JP)

(73) Assignee: V TECHNOLOGY CO., LTD.,
Kanagawa (JP)

( * ) Notice: Subject to any disclaimer, the term of this
patent is extended or adjusted under 35
U.S.C. 154(b) by 298 days.

(21) Appl. No.: 18/573,270

(22) PCT Filed: Mar. 10, 2022

(86) PCT No.: PCT/JP2022/010583
§ 371 (c)(1),
(2) Date: Dec. 21, 2023

(87) PCT Pub. No.: WO2023/002674
PCT Pub. Date: Jan. 26, 2023

(65) Prior Publication Data
US 2024/0371598 A1 Nov. 7, 2024

(30) Foreign Application Priority Data

Jul. 19, 2021 (JP) ................................. 2021-118739

(51) Int. Cl.
*H01J 37/16* (2006.01)
*H01J 37/09* (2006.01)
(Continued)

(52) U.S. Cl.
CPC .............. *H01J 37/16* (2013.01); *H01J 37/09*
(2013.01); *H01J 37/244* (2013.01);
(Continued)

(58) Field of Classification Search
CPC .......... H01J 37/09; H01J 37/16; H01J 37/244;
H01J 37/317; H01J 37/08; H01J 37/18;
(Continued)

(56) References Cited

U.S. PATENT DOCUMENTS

2002/0121504 A1 9/2002 Miura et al.
2008/0018460 A1 1/2008 Ishiguro et al.

FOREIGN PATENT DOCUMENTS

EP 0109147 A2 5/1984
JP S59-90926 A 5/1984
(Continued)

OTHER PUBLICATIONS

Office Action, mailed Apr. 15, 2025, issued for the corresponding
Japanese Patent Application No. 2021-118739, pages, with English
machine translation.
(Continued)

*Primary Examiner* — Jurie Yun
(74) *Attorney, Agent, or Firm* — LUCAS & MERCANTI,
LLP

(57) ABSTRACT

A focused ion beam system includes a beam emitter and an
aperture. The beam emitter is equipped with a focused ion
beam optical system which works to control an ion beam, as
produced by an ion source, and emit the ion beam into an
inner space. The aperture communicates with the inner space
to permit the ion beam, as emitted from the beam emitter, to
pass therethrough, thereby having a target substrate exposed
to the ion beam. The inner space is evacuated in a vacuum.
A movable sealing valve is provided which selectively opens
or closes the aperture.

8 Claims, 6 Drawing Sheets

(51) Int. Cl.
    *H01J 37/244*      (2006.01)
    *H01J 37/317*      (2006.01)

(52) U.S. Cl.
    CPC ..... *H01J 37/3174* (2013.01); *H01J 2237/166*
        (2013.01); *H01J 2237/2448* (2013.01); *H01J*
           *2237/24564* (2013.01); *H01J 2237/31749*
                               (2013.01)

(58) Field of Classification Search
    CPC .............. H01J 37/3056; H01J 37/3174; H01J
                   2237/166; H01J 2237/188; H01J
             2237/2448; H01J 2237/24564; H01J
                             2237/31749
    See application file for complete search history.

(56)                     References Cited

FOREIGN PATENT DOCUMENTS

| JP | 2002-257998 A | 9/2002 |
| JP | 2005-147956 A | 6/2005 |
| JP | 2008-027669 A | 2/2008 |

OTHER PUBLICATIONS

Office Action, mailed May 21, 2025, which was issued for the corresponding Taiwanese Patent Application No. 111110460, 7 pages, with English translation.

International Search Report dated May 17, 2022, for the corresponding patent application No. PCT/JP2022/010583, with English translation.

Office Action, mailed on Feb. 9, 2026, which was issued for the corresponding Korean patent application No. 10-2023-7044770, 9 pages, with English translation.

FOCUSED ION BEAM SYSTEM

CROSS REFERENCE TO RELATED APPLICATION

This Application is a 371 of PCT/JP2022/010583 filed on Mar. 10, 2022, which claimed priority of Japanese Application No. 2021-118739 filed on Jul. 19, 2021, both of which are incorporated herein by reference.

TECHNICAL FIELD

The present invention generally relates to a focused ion beam system.

BACKGROUND ART

There is known a charged particle beam lithography system (e.g., Patent literature 1) which includes a beam emitter and a vacuum envelope machine. The beam emitter has an inner space kept in a high vacuum and also has a beam output tip which a tip opening formed. The vacuum envelope machine is arranged to surround the tip opening of the beam emitter and function to locally create a vacuum space around the tip opening. The vacuum envelope machine is capable of being arranged close to an outer surface (i.e., a target treatment surface) of a semiconductor wafer to greatly shorten a distance between the tip of the beam emitter and the wafer, thereby keeping a gap between the tip of the beam emitter and the outer surface of the wafer at a high vacuum level.

The charged particle beam lithography system needs to control the position of a charged particle beam or make a variety of adjustments on the charged particle beam in the following operations. Specifically, the charged particle beam emitted from the tip opening is directed to fiducial marks etched on an alignment pad placed around the semiconductor wafer. Information produced by the exposure of the fiducial marks to the charged particle beam is used to correct the position and/or change the shape of the charged particle beam in the beam emitter. The reason why the fiducial marks on the alignment pad are used to obtain the information is because direct exposure of the semiconductor wafer to the charged particle beam will cause damage to the semiconductor wafer. The above information obtaining operation is performed each time when a semiconductor wafer is set in the charged particle beam lithography system.

PRIOR ART DOCUMENT

Patent Literature

Patent Literature 1: Japanese Patent First Publication No. 1984-90926

SUMMARY OF THE INVENTION

Problem to be Solved by the Invention

The above-described charged particle beam lithography system needs to be moved to above the fiducial marks on the alignment pad each time the position and/or shape of the charged particle beam is aligned, thereby encountering a drawback in that a takt time required to complete processing of semiconductor wafers.

The above-described charged particle beam lithography system also faces a drawback in that when the vacuum envelope machine is moved away from a target surface of a semiconductor wafer to be treated, it will result in a difficulty in keeping a gap between the tip of the beam emitter and the target surface at a high vacuum level. Usually, after the charged particle beam lithography system is moved away from a semiconductor wafer to a standby position, the semiconductor wafer is replaced. This will cause the inside of the beam emitter to be temporarily at a low vacuum level upon replacement of the semiconductor wafer. After the semiconductor wafer is replaced with next one, the charged particle beam lithography system is, therefore, moved close to the semiconductor wafer and then actuates the vacuum envelope machine to evacuate the beam emitter in a high vacuum. This requires time to move the charged particle beam lithography system and regulate the pressure in the beam emitter. The above type of charged particle beam lithography system, therefore, has a problem that the takt time will be undesirably increased to complete the treatment of semiconductor wafers.

The invention was made in view of the above problem. It is an object of this invention to provide a focused ion beam system which is capable of shortening the takt time without causing damage to a target substrate when an ion beam is aligned.

Means for Solving the Problem

In order to solve the above problem and achieve the object, one aspect of the invention is to provide a focused ion beam system which comprises: (a) a beam emitter which includes a focused ion beam optical system working to control an ion beam, as produced by an ion source, and emit the ion beam into an inner space; and (b) an aperture which communicates with the inner space to permit the ion beam, as emitted from the beam emitter, to pass therethrough, thereby having a target substrate exposed to the ion beam. The inner space is evacuated in a vacuum. A movable sealing valve is provided which selectively opens or closes the aperture.

The above mode preferably includes a secondary charged particle detector which is disposed in the inner space to capture a secondary charged particle. The movable sealing valve may have a portion which is irradiated with the ion beam when the aperture is closed and on which a fiducial alignment mark is arranged.

The above mode preferably includes a current sensor connecting with the fiducial alignment mark.

The above mode preferably has the beam emitter which includes a focused ion beam column in which the focused ion beam optical system is disposed and a head which is disposed on a beam output end of the focused ion beam column and equipped with a differential pumping device.

The above mode preferably has the inner space which communicates with the focused ion beam column and the head. The head preferably has the aperture formed therein.

The above mode preferably has the inner space which includes space defined in the focused ion beam column. The aperture is preferably formed in the beam output end of the focused ion beam column.

The above mode preferably has the movable sealing valve which is reciprocable between a position where the movable sealing valve closes the aperture and a standby position where the movable sealing valve blocks emission of the ion beam into the inner space.

The above mode preferably has the fiducial alignment mark made of a metal mesh.

The above mode preferably has the current sensor which is made of a picoammeter.

Beneficial Advantages of the Invention

The focused ion beam system according to the invention offers a beneficial advantage that a takt time required to process a target substrate using a focused ion beam is minimized.

BRIEF DESCRIPTION OF THE DRAWINGS

FIG. 1 is a structural view which schematically illustrates a focused ion beam system with a movable sealing valve opened according to the first embodiment of the invention.

MODE FOR CARRYING OUT THE INVENTION

Figure 2:
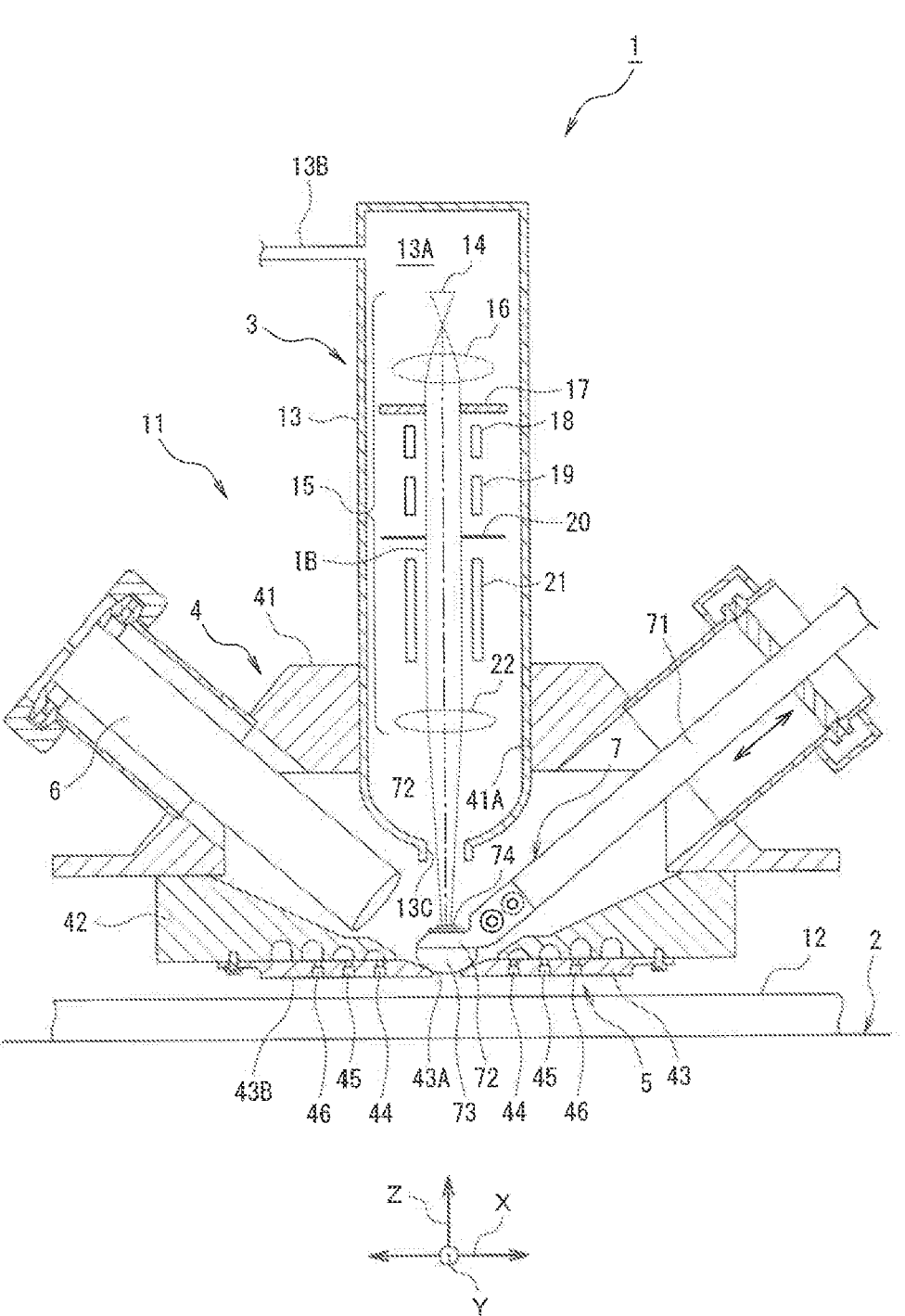
FIG. 2 is a structural view which schematically illustrates a focused ion beam system with a movable sealing valve closed according to the first embodiment of the invention.

Referring to the accompanying drawings, various embodiments are described below. The drawings schematically show focused ion beam systems, so each of the members constituting each of the systems is different from what is real in size, in dimensional ratio, in number of its parts, in configuration and the like. In addition, the drawings contain portions which are the same but different in size, dimensional ratio, and configuration.

First Embodiment

Structure of Focused Ion Beam System

The focused ion beam system 1 according to the first embodiment of the invention is used as a correction machine for photomasks employed in manufacturing, for example, LCDs (Liquid Crystal Displays), OLEDs (Organic Electroluminescence Displays) or FPDs (Flat Panel Displays).

Figure 1:
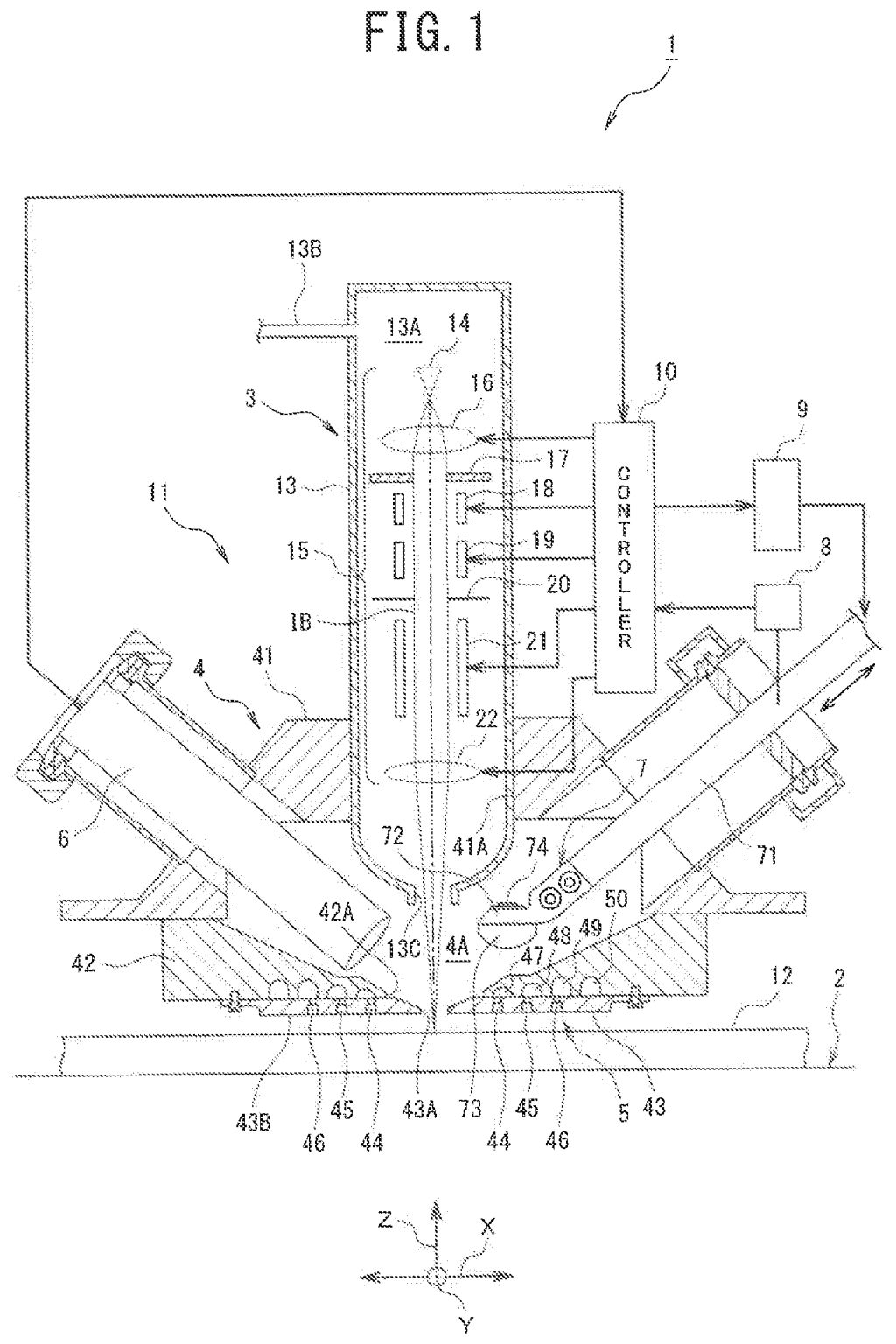

The focused ion beam system 1 in this embodiment, as illustrated in FIG. 1, includes the substrate holding stage 2, the focused ion beam column 3, the head 4, the differential pumping device 5, the secondary charged particle detector 6, the movable sealing valve 7, the current sensor 8, the valve actuator 9, and the controller 10. The focused ion beam column 3 and the head 4 constitute the beam emitter 11.

The substrate holding stage 2 is designed to have held thereon the target substrate 12 which is to be treated or processed by the focused ion beam system 1. The target substrate 12 in this embodiment is a large-sized photomask. The substrate holding stage 2 is movable relative to the beam emitter 11 in the X-Y direction. The substrate holding stage 2 may be designed to be also movable relative to the beam emitter 11 in the Z-direction.

Focused Ion Beam Column

The focused ion beam column 3 is equipped with the housing 13. The housing 13 has defined therein the inner column chamber 13A in which the liquid metal ion source 14 and the focused ion beam optical system 15 are disposed. A vacuum pump (e.g., ion pump), not shown, is joined to an upper portion of the housing 13 using the connecting pipe 13B. The housing 13 has formed in a tip (i.e., a lower end) thereof the column tip aperture 13C through which the ion beam IB passes.

The liquid metal ion source 14 has gallium (Ga+) that is liquid metal stored therein. The liquid metal ion source 14 works to ionizes the liquid metal using the field emission technique and discharges it from a head thereof.

The focused ion beam optical system 15 includes the condenser lens 16, the aperture 17, the astigmatism alignment device 18, the blanker 19, the blanking aperture 20, the deflector 21, and the objective lens 22. In this embodiment, operations of the condenser lens 16, the astigmatism alignment device 18, the blanker 19, the deflector 21, and the objective lens 22 are controlled in response to control signals outputted from the controller 10.

The condenser lens 16 is made of an electrostatic lens. The gallium ions (Ga+) emitted from the liquid metal ion source 14 is accelerated at acceleration voltage (or partially by ion overvoltage) by extraction electrodes, not shown, arranged on an uppermost-stream side of the condenser lens 16, thereby producing an ion beam IB.

The astigmatism alignment device 18 is made of octapole lens, not shown. The astigmatism alignment device 18 changes levels of voltage at the octapole lens in response to the control signal from the controller 10 to alter the degree with which the axis of the ion beam IB should be shifted and the shape of the ion beam IB.

The blanker 19 is applied with blanking voltage in response to the control signal from the controller 10 to deflect the ion beam IB toward a light shielding portion (i.e., a non-opening area) of the blanking aperture 20 without directing the ion beam IB toward the target substrate 12.

The deflector 21 works to deflect the ion beam IB to steer it in the X-Y direction. The objective lens 22 is made of an electrostatic lens and responsive to the control signal from the controller 10 to focus the ion beam IB on a surface of the target substrate 12.

Head

The head 4 is, as clearly illustrated in FIG. 1, in the shape of a hollow disc and arranged to have the center axis thereof which is aligned or coaxial with that of the housing 13. The head 4 includes the disc-shaped upper body 41, the disc-shaped lower body 42, and the groove-formed plate 43. The upper body 41 is in a frustoconical shape. The head 4 has the inner head chamber 4A defined therein. The inner head chamber 4A communicates with the inner column chamber 13A of the housing 13 of the focused ion beam column 3, thereby defining an inner space in the beam emitter 11 which is evacuated in a high vacuum by a vacuum pump, not shown, which connects with the housing 13 through the connecting pipe 13B.

The upper body 41 has formed in a middle portion thereof the hollow cylindrical column joint hole 41A which extends through the upper body 41 in a direction in which a rotation axis of the upper body 41 extends. The lower body 42 has the lower body aperture 42A formed in the center thereof. The groove-formed plate 43 has the head tip aperture 43A formed in the center thereof. The head tip aperture 43A permits the ion beam IB to pass therethrough, so that the ion beam IB is emitted to the target substrate 12. The focused ion beam column 3 has a head passing through the column joint hole 41A. The differential pumping device 5 is disposed on a bottom surface of the lower body 42 and surrounds the head tip aperture 43A.

Differential Pumping

The differential pumping device 5 is made up of the lower body 42 and the groove-formed plate 43. The groove-formed plate 43 has the lower surface 43B in which, for example, three annular grooves 44, 45, and 46 are formed. The annular grooves 44, 45, and 46 are arranged coaxially with each other at a given interval away from each other in a radial direction of the groove-formed plate 43. The annular grooves 44, 45, and 46 surround the head tip aperture 43A. The lower body 42 has formed in a lower surface thereof the connecting grooves 47, 48, 49, and 50 which selectively communicate with the annular grooves 44, 45, and 46. The connecting grooves 47, 48, 49, and 50 connect with a vacuum pump using vacuum paths, not shown.

In this embodiment, the annular grooves 44, 45, and 46 work to achieve differential pumping to generate different pressures in the annular grooves 44, 45, and 46. The pressure in the outer annular groove 46 is the lowest. The pressure in the inner annular groove 44 is the highest. The pressure in the annular groove 45 is intermediate between those in the annular grooves 44 and 46. In other words, the pressure is decremented from the annular groove 46 to the annular groove 44.

Secondary Charged Particle Detector

The head 4 is equipped with the secondary charged particle detector 6. The secondary charged particle detector 6 has a head disposed inside the inner head chamber 4A. The secondary charged particle detector 6 connects with the controller 10 and detects and outputs information to the controller 10.

In this embodiment, the secondary charged particle detector 6 is made of a scintillator. The secondary charged particle detector 6 extends through the lateral side of the head tip aperture 43A to have the head disposed inside the heat tip aperture 43A without directly exposing the ion beam IB. The secondary charged particle detector 6 connects with a photomultiplier, not shown, which amplifies light generated in the secondary charged particle detector 6.

The secondary charged particle detector 6 works to capture secondary charged particles, as ejected from the metallic mesh 74 when exposed to the ion beam IB, and obtain information (which will also be referred to below as surface information) about a condition of the surface of the metallic mesh 74. The metallic mesh 74 is disposed as a fiducial alignment mark on the movable sealing valve 7 which will be described later in detail. The surface information about the metallic mesh 74 derived from the secondary charged particle detector 6 is used to align the position of the ion beam IB or achieve various adjustments of the ion beam IB.

Movable Sealing Valve

The movable sealing valve 7, as can be seen in FIGS. 1 and 2, works to open or close the head tip aperture 43A within the head 4. The movable sealing valve 7, as clearly illustrated in FIGS. 1 to 3, includes the rod 71, the valve body 72, the vacuum pad 73, and the metallic mesh (i.e., fiducial alignment mark) 74.

The rod 71 extends into the head 4 and is reciprocable in a lengthwise direction thereof while keeping a vacuum in the inner head chamber 4A. The rod 71 is moved by the valve actuator 9 disposed outside the head 4. The valve actuator 9 is responsive to the control signal from the controller 10 to actuate or move the rod 71. In this embodiment, the valve actuator 9 may be implemented by an air actuator.

Figure 3:
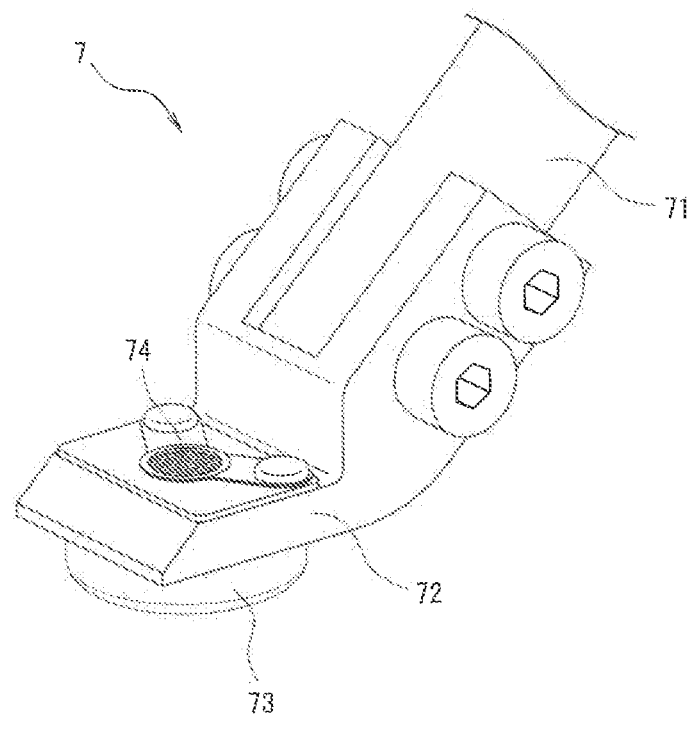
FIG. 3 is a perspective view which illustrates a highlight, i.e., a tip portion of a movable sealing valve installed in a focused ion beam system according to the first embodiment of the invention.

The valve body 72 is, as can be seen in FIG. 3, secured to the head of the rod 71. The valve body 72 has the vacuum pad 73 disposed on the lower surface thereof. The vacuum pad 73 is made from, for example, fluorine resin. The vacuum pad 73 is moved following movement of the rod 71 between an open state (will also be referred to below as a standby position) where the head tip aperture 43A is, as illustrated in FIG. 1, is opened without the vacuum pad 73 interfering with the ion beam IB and a closed state where the head tip aperture 43A is, as illustrated in FIG. 2, closed.

Figure 4:
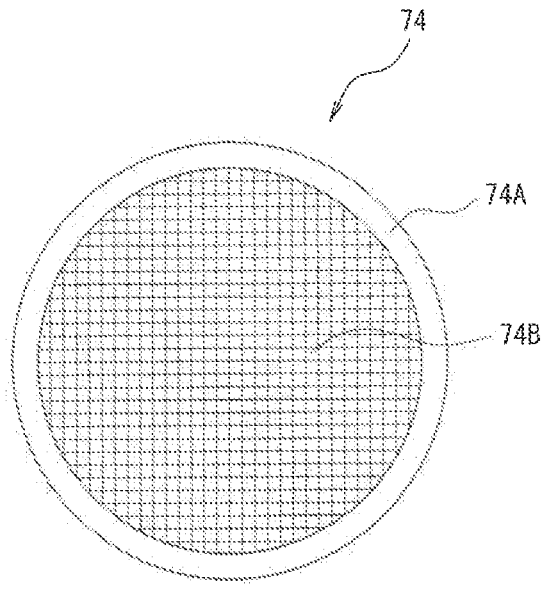
FIG. 4 is a plan view which illustrates a metallic mesh (i.e., fiducial alignment mark) disposed on a movable sealing valve of a focused ion beam system according to the first embodiment of the invention.
Figure 4:
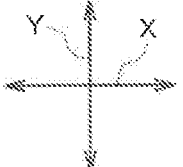

The metallic mesh 74 is moved following movement of the rod 71 between a standby position illustrated in FIG. 1 where the metallic mesh 74 does not interfere with the ion beam IB and a beam-exposure position illustrated in FIG. 2 where the metallic mesh 74 is exposed to the ion beam IB. The metallic mesh 74, as clearly illustrated in FIG. 4, includes the circular frame 74A and the circular metal mesh body 74B fit in the frame 74A. The metallic mesh 74 may be detachably secured to the valve body 72. The valve body 72 may be detachably secured to the rod 71. The metal mesh body 74B may be made of metallic material, such as molybdenum (Mo), stannum (Sn), and/or aurum (Au).

As apparent from the above discussion, in the focused ion beam system 1, when exposing the ion beam IB, the metallic mesh 74 will eject secondary charged particles. The secondary charged particle detector 6 captures the secondary charged particles. The controller 10 derives the surface information about the metallic mesh 74 from the secondary charged particle detector 6 and analyzes it in order to align a spot where the ion beam IB is emitted or make various adjustments on the ion beam IB.

In this embodiment, the current sensor 8 is connected to the metallic mesh 74 of the movable sealing valve 7 through the rod 71. The current sensor 8 is made of a picoammeter to measure small dc current. In other words, the movable sealing valve 7 is capable of measuring a value of electrical current in the ion beam IB using the current sensor 8. The controller 10 analyzes the value of electric current measured by the current sensor 8 to achieve the adjustments of the ion beam IB.

Operation and Action of Focused Ion Beam System

Referring back to FIG. 1, when it is required for the focused ion beam system 1 to emit the ion beam IB onto the target substrate 12 to, for example, modify or correct a mask pattern, the groove-formed plate 43 of the differential pumping device 5 is first placed to have the lower surface thereof located at a small interval away from the target substrate 12 to achieve the differential pumping.

An inner space defined by the inner column chamber 13A and the inner head chamber 4A is evacuated by a vacuum pump (not shown) connecting with the connecting pipe 13B of the housing 13 and then kept at a given vacuum level.

The movable sealing valve 7 is arranged in the standby position, as illustrated in FIG. 1, where the valve body 72 does not interfere with the ion beam IB. In other words, the vacuum pad 73 and the metallic mesh 74 are placed in the standby positions thereof, so that the head tip aperture 43A is opened, and the metallic mesh 74 is not exposed to the ion beam IB.

Afterwards, the focused ion beam column 3 emits the ion beam IB onto the target substrate 12 to modify or correct the target substrate 12.

When it is required for the focused ion beam system 1 to align the position of the ion beam IB or make the various adjustments of the ion beam IB, the movable sealing valve 7 is, as illustrated in FIG. 2, actuated to move the vacuum pad 73 to close the head tip aperture 43A. The inner space including the inner column chamber 13A and the inner head chamber 4A is hermetically isolated by the movable sealing valve 7 from an outer space around the focused ion beam system 1, so that the pressure in the inner space is kept at a required level.

Next, the metallic mesh 74 of the movable sealing valve 7 is raster-scanned using the ion beam IB. The emission of the ion beam IB onto the metallic mesh 74 will generate secondary charged particles. The secondary charged particle detector 6 captures the secondary charged particles and outputs them to the controller 10 in the form of a detection signal. The position of emission of the ion beam IB and the detection signal are mapped to each other, thereby enabling an image (which will also be referred to as a SIM image) of the metallic mesh 74 to be produced and observed using a SIM (Scanning Ion Microscope). The SIM image may be observed to align the position of the ion beam IB and/or achieve adjustment of power, focusing, axis, and/or correction of astigmatism of the ion beam IB, thereby optimizing the condition of the ion beam IB.

After the above adjustments of the ion beam IB are completed, a lens voltage at the objective lens 22 may be controlled to focus the ion beam IB onto a spot of the surface of the target substrate 12 which is located at a designed distance away from the metallic mesh 74. This enables the target substrate 12 to be processed or treated in a short time without need for adjustment of focusing the ion beam IB onto the surface of the target substrate 12. It is simultaneously possible to measure the electric current in the ion beam IB using the current sensor 8 connecting with the movable sealing valve 7, which enables the controller 10 to control the electric current in the ion beam IB.

Beneficial Advantages Offered by the First Embodiment

When the condition of a photomask (i.e., the target substrate 12) is corrected using the focused ion beam system 1, it usually requires to align the position of the ion beam IB or make various kinds of adjustment to the ion beam IB during the correction of the condition of the photomask. The high-accuracy correction of the condition of the photomask generally requires the condition of the ion beam IB to be kept properly at all times regardless of the size of the photomask. The focused ion beam system 1 in this embodiment is capable of controlling the ion beam IB quickly during the correction of the condition of the photomask without breaking a vacuum in the inner space (including the inner column chamber 13A and the inner head chamber 4A), thereby decreasing the takt time to complete the processing of the target substrate 12.

The vacuum in the inner space (including the inner column chamber 13A and the inner head chamber 4A) is, as described above, not broken each time the adjustments are made for the ion beam IB, thereby resulting in a great decrease in load on the vacuum pump, not shown, connected to the connecting pipe 13B.

The focused ion beam system 1 in this embodiment, as described above, has the movable sealing valve 7 arranged in the inner head chamber 4A in which the secondary charged particle detector 6 is disposed, thereby facilitating the ease with which the head tip aperture 43A is opened or closed without affecting the positional relation between the beam emitter 11 and the target substrate 12.

The focused ion beam system 1 in this embodiment is designed to automatically move the metallic mesh 74 to the location where it is exposed to the ion beam IB when the movable sealing valve 7 is closed, thereby enabling the adjustments to be made quickly for the ion beam IB.

The structure of the focused ion beam system 1 in this embodiment eliminates a risk that the ion beam IB may be emitted to the target substrate 12 when the secondary charged particles are captured, thereby preventing the ion beam IB from causing damage to the target substrate 12.

For comparison, the prior art systems usually make adjustments, such as alignment, focusing, and correction of astigmatism of the ion beam IB, while the ion beam IB is being emitted to the target substrate 12, and secondary charged particles ejected from the target substrate 12 are detected.

Use of gallium which is high in mass number to produce the ion beam IB in the liquid metal ion source 14 will result in an increased rate of sputtering treatment, while it will encounter a drawback in that a photomask irradiated with the ion beam IB is inevitably processed.

For instance, in case of use of the focused ion beam system 1 to correct the condition of a photomask, when a long time is taken to achieve the adjustments, it may lead to a risk that an area around defects (i.e., correction scheduled portions) of the photomask may be undesirably treated. The above-described structure of the focused ion beam system 1 is, however, designed not to use the target substrate 12 for the adjustments of the ion beam IB, thereby eliminating a risk of damage to the target substrate 12.

Second Embodiment

Figure 5:
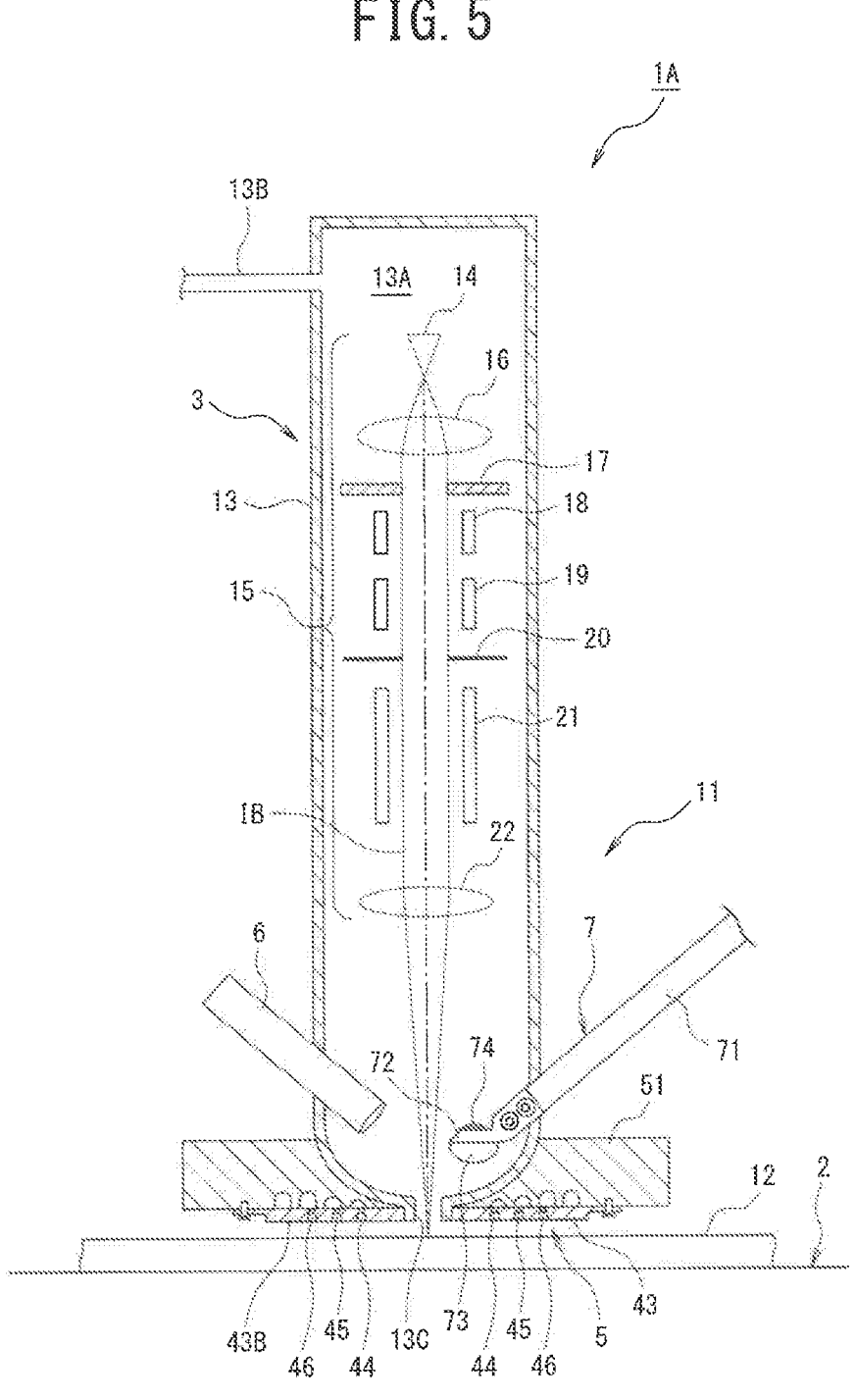
FIG. 5 is a structural view which schematically illustrates a focused ion beam system with a movable sealing valve opened according to the second embodiment of the invention.
Figure 6:
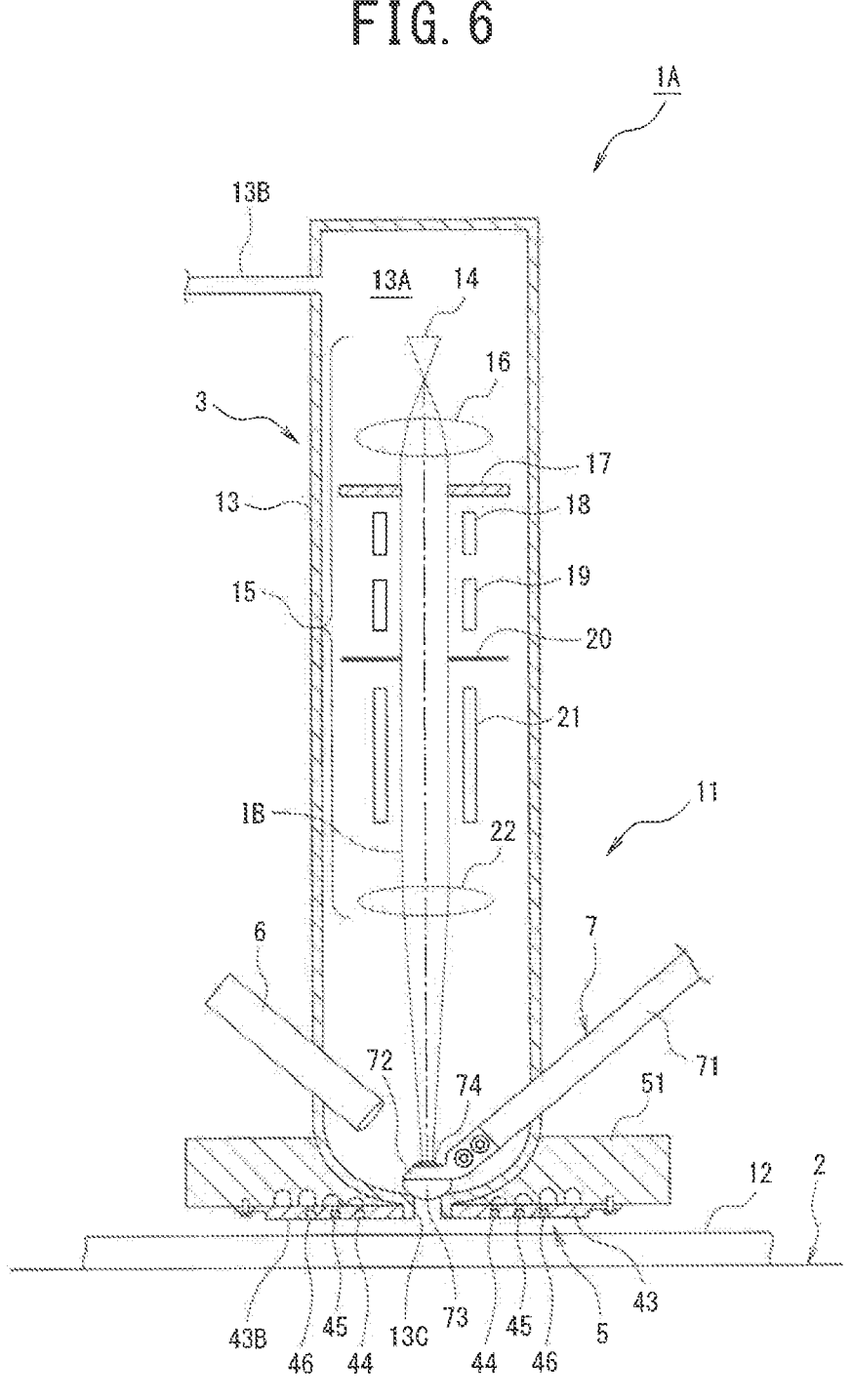
FIG. 6 is a structural view which schematically illustrates a focused ion beam system with a movable sealing valve closed according to the second embodiment of the invention.

FIGS. 5 and 6 illustrate the focused ion beam system 1A according to the second embodiment of the invention. The following discussion will refer only to portions of the focused ion beam system 1A which are different from those in the first embodiment. Explanation of the same portions as those in the first embodiment will be omitted here.

In the focused ion beam system 1A, the inner column chamber 13A of the housing 13 of the focused ion beam column 3 defines an inner space in the invention. The column tip aperture 13C defines a selectively closed or opened aperture in the invention. In this embodiment, the head plate 51 and the groove-formed plate 43 constitute the head 4 in the first embodiment. The differential pumping device 5 is made up of the head plate 51 and the groove-formed plate 43.

In this embodiment, the secondary charged particle detector 6 and the movable sealing valve 7 are arranged to be exposed to a lower portion of the inner column chamber 13A of the housing 13. The vacuum pad 73 of the movable sealing valve 7 serves to selectively open or close the column tip aperture 13C. Other arrangements of the focused ion beam system 1A are the same as those in the focused ion beam system 1 in the first embodiment.

The focused ion beam system 1A offers substantially the same beneficial advantages as those of the focused ion beam system 1. The focused ion beam system 1A is, as described above, designed to have the secondary charged particle detector 6 and the movable sealing valve 7 arranged in the inner column chamber 13A, thereby also resulting in decrease in total size and weight of the focused ion beam system 1A.

Other Embodiments

Although the embodiments of the present invention have been described, it should not be understood that the statements and drawings forming part of the disclosure of the embodiments limit the present invention. Various alternative embodiments, examples and operational techniques will become apparent to those skilled in the art from this disclosure.

The above embodiments have referred to the target substrate 12 implemented by a photomask, but however, may alternatively be another member which is required to be processed using the ion beam IB and may be treated for purposes other than the correction of condition thereof.

The above embodiments have referred to the valve actuator 9 made of an air actuator, but however, may be implemented by another type of actuator.

The above embodiments have referred to the metallic mesh 74 used as a fiducial alignment mark, but however, another type or shape of mark or pattern may alternatively be utilized for the above-described purposes.

The above embodiments have referred to the secondary charged particle detector 6 made of a scintillator, but however, may alternatively be made of a multi-channel plate (MCP) capable of detecting various types of charged particles, electrons, or ions.

The above embodiments have referred to the current sensor 8 made of a picoammeter, but however, the focused ion beam system 1 may alternatively be designed not to have the current sensor 8.

What is claimed is:

1. A focused ion beam system comprising:
a beam emitter which includes a focused ion beam optical system working to control an ion beam, as produced by an ion source, and emit the ion beam into an inner space;
an aperture which communicates with the inner space to permit the ion beam, as emitted from the beam emitter, to pass therethrough, thereby having a target substrate exposed to the ion beam; and
a secondary charged particle detector which is disposed in the inner space to capture a secondary charged particle, wherein
the inner space is evacuated in a vacuum,
a movable sealing valve is provided which selectively opens or closes the aperture, and
the movable sealing valve has a portion which is irradiated with the ion beam when the aperture is closed and on which a fiducial alignment mark is arranged.

2. The focused ion beam system as set forth in claim 1, further comprising a current sensor connecting with the fiducial alignment mark.

3. The focused ion beam system set forth in claim 2, wherein the current sensor is made of a picoammeter.

4. The focused ion beam system according to claim 1, wherein the beam emitter includes a focused ion beam column in which the focused ion beam optical system is disposed and a head which is disposed on a beam output end of the focused ion beam column and equipped with a differential pumping device.

5. The focused ion beam system set forth in claim 4, wherein the inner space communicates with the focused ion beam column and the head, and the head has the aperture formed therein.

6. The focused ion beam system set forth in claim 4, wherein the inner space includes space defined in the focused ion beam column, and the aperture is formed in the beam output end of the focused ion beam column.

7. The focused ion beam system according to claim 1, wherein the movable sealing valve is reciprocable between a position where the movable sealing valve closes the aperture and a standby position where the movable sealing valve blocks emission of the ion beam into the inner space.

8. The focused ion beam system set forth in claim 1, wherein the fiducial alignment mark is made of a metallic mesh.

* * * * *